(12) United States Patent  
Liu

(10) Patent No.: US 7,659,965 B2
(45) Date of Patent: Feb. 9, 2010

(54) HIGH THROUGHPUT WAFER STAGE DESIGN FOR OPTICAL LITHOGRAPHY EXPOSURE APPARATUS

(75) Inventor: Kun-Yi Liu, Vancouver, WA (US)

(73) Assignee: Wafertech, LLC, Camas, WA (US)

( * ) Notice: Subject to any disclaimer, the term of this patent is extended or adjusted under 35 U.S.C. 154(b) by 409 days.

(21) Appl. No.: 11/544,417

(22) Filed: Oct. 6, 2006

(65) Prior Publication Data

US 2008/0084550 A1    Apr. 10, 2008

(51) Int. Cl.
G03B 27/58 (2006.01)
G03B 27/42 (2006.01)
G03B 27/72 (2006.01)
G03B 27/32 (2006.01)

(52) U.S. Cl. ............................ 355/74; 355/53; 355/71; 355/72; 355/77; 430/311

(58) Field of Classification Search .................... 355/53, 355/71, 72, 74, 77; 430/5, 22, 311; 356/400, 356/401
See application file for complete search history.

(56) References Cited

U.S. PATENT DOCUMENTS

| 5,760,881 | A  | * | 6/1998 | Miyazaki et al. ............... 355/71 |
| 6,239,862 | B1 |   | 5/2001 | Mulkens et al. |
| 2003/0138742 | A1 | * | 7/2003 | Irie et al. ..................... 430/396 |
| 2006/0250594 | A1 | * | 11/2006 | Iwashita et al. ................ 355/53 |

* cited by examiner

Primary Examiner—Alan A Mathews
(74) Attorney, Agent, or Firm—Duane Morris LLP

(57) ABSTRACT

An optical lithography exposure apparatus which may be a stepper or a scanner, provides a wafer chuck that retains a wafer and at least one opaque exposure shield that extends over a discrete peripheral edge portion of the wafer thereby preventing illumination from exposing the portion of the wafer beneath the exposure shield. In a positive photoresist system, the portions of the wafer blocked from exposure by the shields, include alignment marks and the unexposed photoresist remains over the alignment marks thereby protecting the alignment marks from destruction or damage during subsequent patterning operations used to form patterns in the film being patterned.

18 Claims, 5 Drawing Sheets

HIGH THROUGHPUT WAFER STAGE DESIGN FOR OPTICAL LITHOGRAPHY EXPOSURE APPARATUS

FIELD OF THE INVENTION

The present invention relates to an optical lithography exposure apparatus and a method for exposing a semiconductor wafer using the same. More particularly, the invention is directed to a stepper or scanner with an exposure shield that blocks illumination from exposing a selected and discrete portion of a semiconductor wafer such as containing the alignment mark.

BACKGROUND OF THE INVENTION

In today's rapidly advancing semiconductor manufacturing industry, semiconductor devices are formed on semiconductor wafers and the time required to process a semiconductor wafer at any given stage, is critically important. A reduction in processing time at any particular processing operation means that more wafers can be processed in a fixed time period and this increased manufacturing tool output improves the efficiency of the tool producing a cost savings. Indeed, it is desirable to increase throughput, often expressed as WPH, wafers per hour, for every processing tool used in the fabrication of a semiconductor device as every increase in wafer output per day includes an associated cost savings. Additionally, as the total cycle time for producing a completed semiconductor wafer decreases, so, too, does the cost associated with producing the semiconductor devices that are formed on the substrate.

In optical lithography exposure tools such as steppers and scanners, each individual chip or a block of chips is separately exposed by the tool which then steps to the next chip or block of chips and repeats the exposure process. If the exposure is a flash exposure, the tool is known as a stepper; if the exposure is done by scanning, the tool is known as a scanner. Each exposure produces a pattern on a photoresist film formed on the substrate. It is conventional in semiconductor device manufacture, to provide alignment marks in the first device pattern and to then align the patterns in subsequent device levels to the alignment mark. To insure accuracy and precision in the very critical alignment process, it is important to prevent damage to or destruction of, the alignment marks after they are formed. In particular, it is important to prevent the etching of the oxide layers formed over the alignment marks because overetching of such oxide layers may result in the exposure and attack of the underlying alignment marks. To prevent such etching, the photoresist is advantageously left covering the alignment marks during the etching process. Positive photoresist is typically used in advanced processing, and it is desirable to prevent the exposure of the positive photoresist formed over the alignment marks, thereby assuring that the photoresist remains over the alignment marks after develop and during the subsequent patterning processing such as etching. At other device levels, in contrast, it is desirable to assure that the deposited film, e.g. metal, is removed so as not to obscure the alignment mark. In this scenario, it is desirable to expose the positive photoresist thereby assuring that the photoresist will be removed. Techniques such as WEE, wafer edge exposure, can be used to expose the entire periphery of a wafer.

Layers such as AA (active area), poly, contact, dual gate, RPO-resist protect oxide and via layers are among the layers in which the photoresist must remain intact over the alignment mark to assure that the etching process used at these layers, does not damage or destroy the underlying alignment marks. In positive photoresist systems, this requires the photoresist over the alignment marks to remain unexposed. Typically, the alignment marks are two in number and disposed in a chip or on a scribe line that is adjacent the peripheral edge of a wafer. Using conventional technology, exposure of the photoresist is prevented by a time-consuming image change procedure that occurs when the stepper/scanner optical lithography exposure apparatus is poised to expose the particular chip or block of chips that includes the alignment mark.

FIG. 1 shows wafer 2 exposed by fifty-one "exposure shots" 4, each exposure shot 4 signifying an individual exposure of the associated portion of wafer 2. Each exposure shot 4 represents a reticle pattern being exposed onto the surface of wafer 2 using the same configuration of the optical lithography exposure apparatus, i.e. stepper or scanner. FIG. 2 shows wafer 2 having been exposed by a plurality of identical exposure shots 4 and two dissimilar, truncated exposure shots 6 over areas of wafer 2 that include the alignment marks and which require a time-consuming image change procedure as will be shown in FIGS. 3 and 4.

FIG. 3 shows the blade configuration used to expose standard exposure shot 4, i.e. the configuration of blades 8, 10, 12 and 14 used to project the reticle image 16 consisting of a plurality of die 18, onto wafer 2. In contrast, FIG. 4 shows the configuration of blades 8, 10, 12 and 14 used to expose a truncated portion of reticle image 16 as truncated exposure shot 6 onto wafer 2. It can be seen that blade 8 must be maneuvered relative to the blade configuration shown in FIG. 3, to produce the configuration shown in FIG. 4. Only truncated portion 20 of reticle image 16 is exposed in truncated exposure shot 6 with portion 22 blocked from exposure by blade 8, for example. In a positive photoresist system, the photoresist remains intact over unexposed portion 22 after develop, protecting subjacent structures such as alignment marks, during the subsequent patterning, e.g. etching operation carried out using the patterned photoresist mask formed by developing the exposed pattern.

The blade change takes up valuable process time and it would be advantageous to maintain the integrity of alignment marks formed near the periphery of a wafer by preventing the exposure of that portion of the wafer using a procedure that does not require a time consuming image change procedure as described above. The present invention is directed to such concerns.

SUMMARY OF THE INVENTION

To achieve these and other needs, and in view of its purposes, the present invention provides an optical lithography exposure apparatus that may be a scanner or stepper. The optical lithography exposure apparatus comprises a chuck for retaining a semiconductor wafer thereon and at least one shield that extends over a discrete portion of a peripheral edge of the semiconductor wafer when the semiconductor wafer is disposed on the chuck. Each shield blocks a subjacent wafer portion from being exposed with illumination. The shield may be retractable and may include a closeable aperture that allows illumination through a discrete portion of the shield.

According to another aspect, the invention provides a method for patterning a semiconductor wafer. The method comprises loading the semiconductor wafer onto a chuck in an optical lithography exposure apparatus, the chuck disposed on a stage. At least one opaque shield is caused to extend inwardly from a peripheral edge of the chuck, over a peripheral edge of the chuck and covering a peripheral edge portion of the semiconductor wafer and the method further comprises exposing the semiconductor wafer with an illumination source such that blocked portions of the wafer beneath the shield are not exposed.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
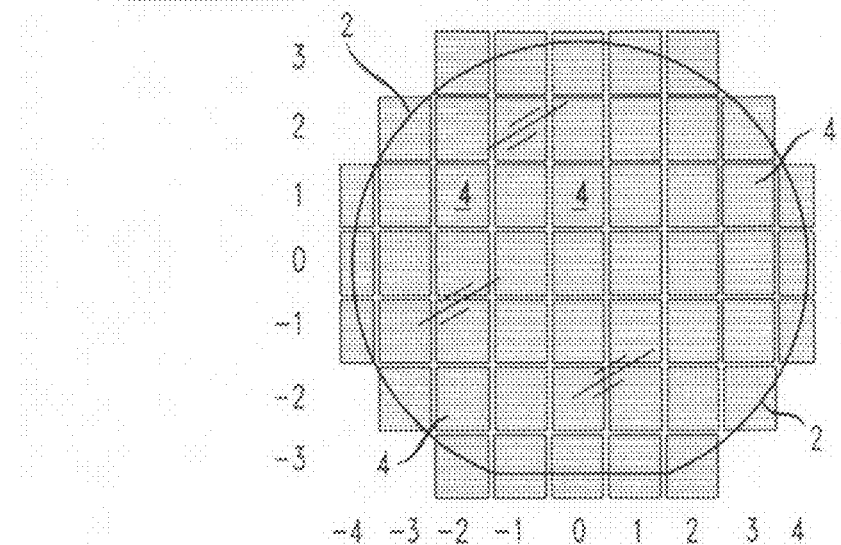
FIG. 1 is a plan view showing fifty-one substantially equal exposure shots according to the PRIOR ART.
Figure 2:
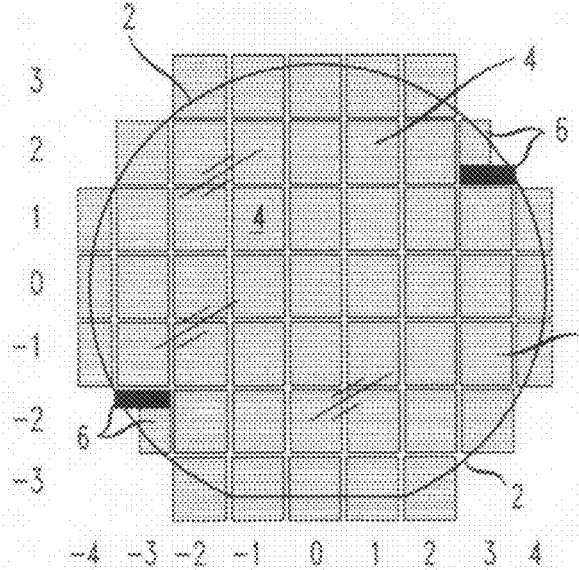
FIG. 2 is a plan view showing forty-nine substantially similar exposure shots and two exposure shots having a different configuration according to the PRIOR ART.
Figure 3:
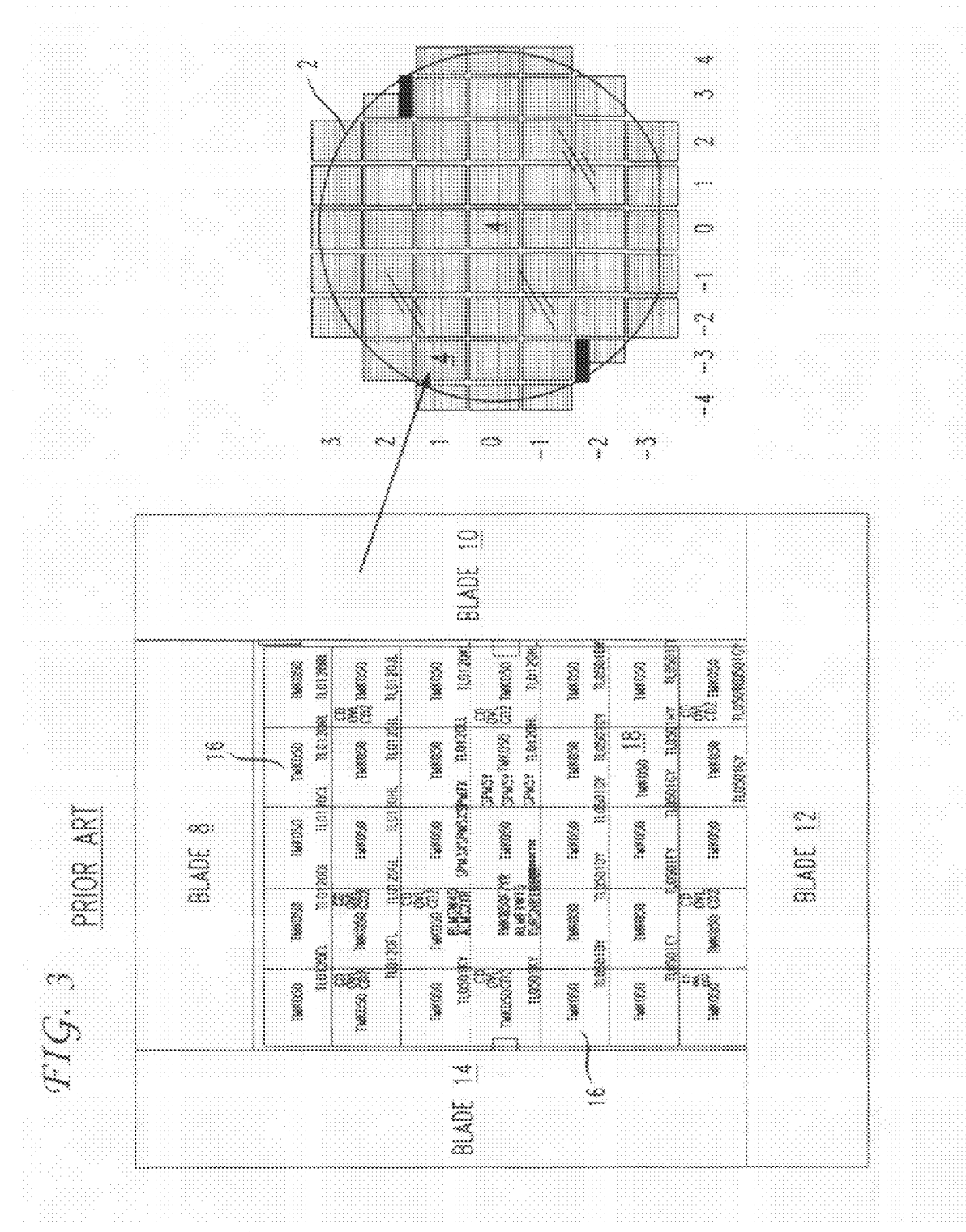
FIG. 3 shows a PRIOR ART blade configuration for forming each of the substantially similar exposure shots of FIGS. 1 and 2.
Figure 4:
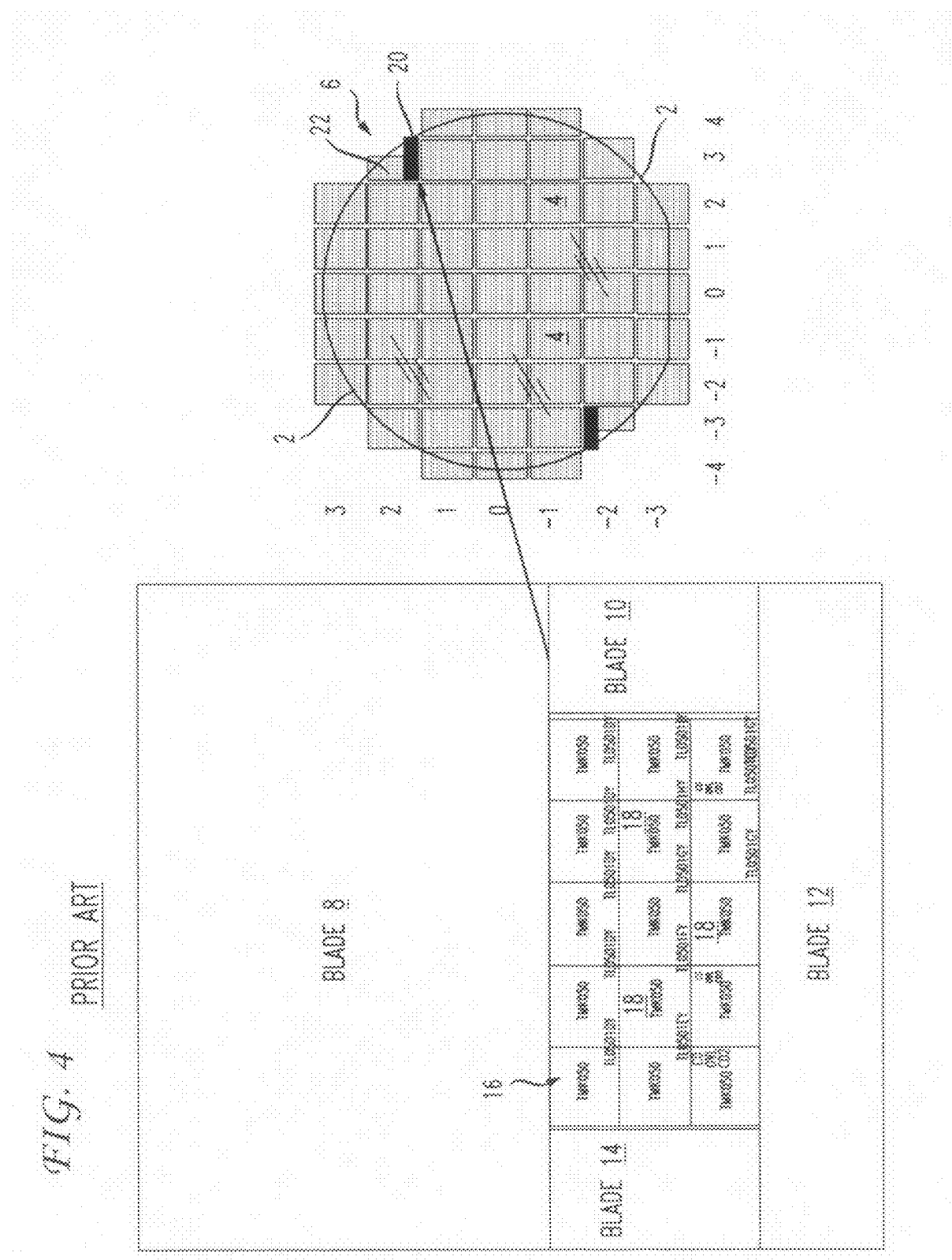
FIG. 4 shows a different blade configuration used to form one of the different exposure shots shown in FIG. 2 according to the PRIOR ART.

The present invention is directed to an optical lithography exposure apparatus used to pattern a semiconductor wafer by forming a plurality of images on the wafer either by a repeating step-and-scan sequence, or a repeating step-and-expose sequence. These tools may be referred to as scanners and steppers, respectively, but according to alternative common nomenclature they may be collectively referred to as steppers because a reticle image is repeatedly formed on a plurality of locations on a wafer by stepping the image onto a new location on a wafer, then exposing the image which is an opaque pattern formed on the clear reticle, either by flash exposure (stepper) or scanning (scanner). The scanner may therefore be considered a type of stepper that scans the exposure field instead of exposing the entire field at once, like a stepper. For simplicity, throughout this disclosure, however, such equipment will be referred to plurally as steppers and scanners. In each system, after an exposure field is exposed onto the wafer's photoresist coated surface, the wafer is moved or "stepped" to the next location where the exposure field is again projected onto the wafer surface. Each exposure field typically includes a plurality of individual die or chips and each instance of the reticle image or exposure field being formed onto the photoresist coated substrate is an exposure shot. After the entire wafer is so exposed, the pattern is developed.

The layers that combine to form a single completed semiconductor device are numerous. Patterns are formed in each of these levels to form different structures and/or to direct the introduction of impurities into particular locations. It is intuitive that each of these levels must be aligned to each of the other levels with great precision. Alignment marks are therefore typically created in the first patterned level and all of the other patterns formed in levels above the initial alignment mark, are aligned to the initial alignment marks. Typically, two alignment marks are formed at generally opposed locations that are about 180° apart and close to the peripheral edge of a semiconductor wafer, to maximize the accuracy of alignment throughout the wafer.

Positive photoresist has become the standard in advanced lithography operations because of its superior resolution. As discussed supra, during the fabrication of a semiconductor device, there are several material layers that should advantageously include photoresist remaining over the alignment marks thereby protecting the alignment marks during the etching operations carried out after a photolithographic pattern is formed on that layer. This prevents damage to the alignment marks and insures alignment accuracy and precision for subsequent layers. Such layers include but are not limited to active area, polysilicon patters such as interconnect and gate layers, various contact patterns formed within dielectric materials, dual gate formation processes, resist protect oxide layers and via patterns formed in intermetal dielectric layers. The system and method of the present invention may therefore be advantageously used at these levels but the invention is not intended to be limited to use at such levels and can be used at various other levels and for a variety of different purposes.

Figure 5:
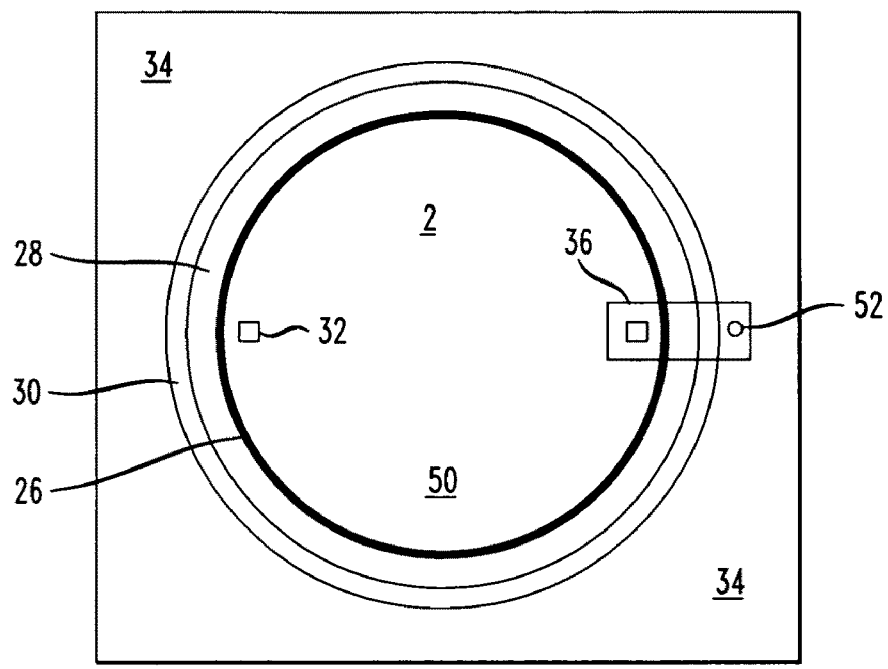
FIG. 5 is a top view showing an exemplary exposure shield of the present invention.
Figure 6:
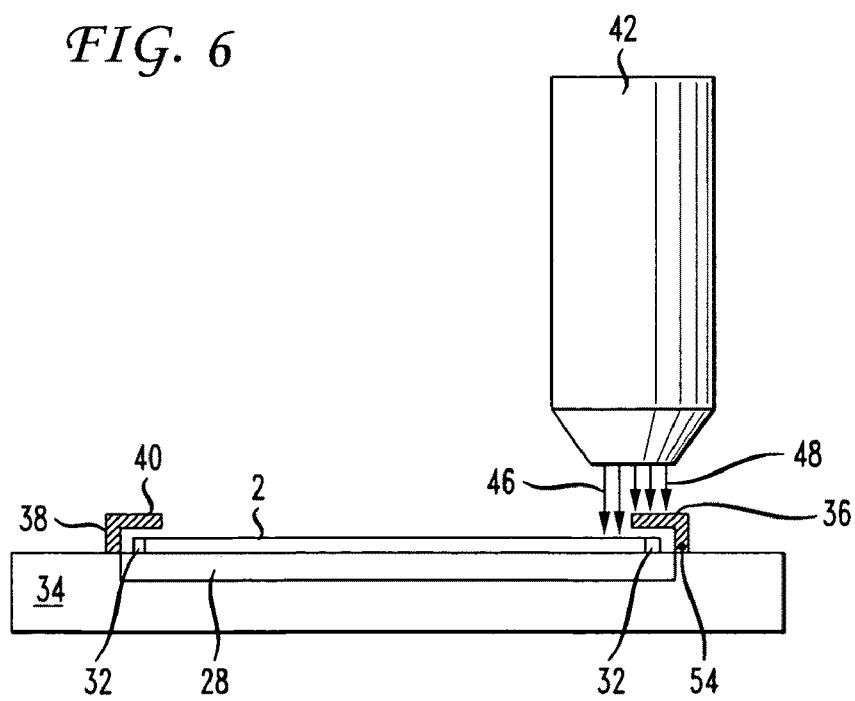
FIG. 6 is side view showing exemplary exposure shields of the present invention.

FIG. 5 shows an inventive shield positioned over an alignment mark and therefore preventing the alignment mark from being exposed by illumination from the illumination source such as shown in FIG. 6. Referring to FIGS. 5 and 6, chuck 28 includes peripheral edge 30 and is disposed on or in stage 34 within an optical lithography exposure apparatus such as a scanner or stepper. Chuck 28 retains wafer 2 which includes peripheral wafer edge 26 and may be formed of semiconductor or other material. Coupled to stage 34 and extending over peripheral edge 30 of chuck 28 and peripheral wafer edge 26, is exposure shield 36. Exposure shield 36 may be made of various opaque materials such as metals although other materials may be used in other exemplary embodiments. Wafer 2 includes two oppositely disposed alignment marks 32 in the illustrated embodiment but there may be additional alignment marks used in other exemplary embodiments and they may be positioned differently. The illustrated embodiment of FIG. 5 shows only one exposure shield 36 covering alignment mark 32 but it should be understood that in various exemplary embodiments, each alignment mark 32 may be covered by, i.e. protected by, a corresponding exposure shield 36. FIG. 6 shows a corresponding exposure shield 36 disposed over each alignment mark 32. Exposure shields 36 are selectively positioned around peripheral wafer edge 26 at locations corresponding to the locations of the alignment marks 32, when the wafer 2 is automatically loaded into the optical lithography exposure apparatus. In an exemplary embodiment, exposure shields 36 may additionally be moveable along peripheral wafer edge 26.

In the illustrated exemplary embodiment, exposure shield 36 includes cantilever section 40 and anchor 38 that couples cantilever section 40 to stage 34. In the illustrated embodiment, cantilever portion 40 is a substantially flat protuberance that is parallel to the plane of wafer 2 but other configurations may be used alternatively. Illumination source 42 provides illumination that, in a series of separate exposure operations, will expose substantially the entire surface 50 of wafer 2 as wafer 2 and illumination source 42 are moved with respect to each other in a series of steps. At each of various locations an image from a reticle, not shown, is projected onto a photoresist film formed on surface 50 of wafer 2, by projecting the pattern formed on the reticle, onto the photoresist film which is later developed. Illumination source 42 may be any of various commercially available illumination sources used in optical lithography exposure apparatuses. Opaque exposure shield 36 is disposed between illumination source 42 and alignment mark 32 formed on wafer 2. In the illustrated location, illumination source 42 provides illumination 46 that reaches photoresist coated surface 50 of wafer 2 and illumination 48 that is blocked from reaching the underlying portion of wafer 2 by opaque exposure shield 36, the underlying portion including alignment mark 32. The photoresist film formed on surface 50 of wafer 2 is not exposed in this area and after a develop process is used to form a pattern in the photoresist film, photoresist remains in the areas on wafer 2 blocked by exposure shields 36. When the subsequent patterning operation such as an etch operation takes place using the photoresist as a mask, the material under the photoresist and over the alignment mark is protected from being etched and no damage can occur to the alignment marks.

Exposure shield 36 may be retractable or otherwise movable to a position in which it does not overhang wafer 2 or chuck 28. In one exemplary embodiment, cantilever portion 40 may be slidable with respect to anchor 38 and in another exemplary embodiment, anchor 38 may be slidable with respect to stage 34. In other exemplary embodiments, other conventional means for retracting or otherwise repositioning exposure shield 36 may be used. For example, a spring loading mechanism may be used to move exposure shield 36 from being positioned over wafer 2 during the illumination process. In one embodiment, the exposure shield 36 may retract by moving radially outward, i.e., orthogonal to the tangent of peripheral wafer edge 26. In yet another exemplary embodiment, exposure shield 36 may be pivotable laterally such as about pivot point 52 shown in FIG. 5. In another exemplary embodiment, exposure shield 36 may be pivotable about an axis that is parallel to wafer 2 and chuck 28.

Electrical wire 54 provides electrical connection between exposure shield 36 and the programming means used to program the optical lithography exposure apparatus. In one exemplary embodiment, the recipe programmed into the optical lithography exposure apparatus to provide the exposure settings and conditions, also communicates with exposure shield 36 via electrical wire 54 to direct exposure shield 36 to be in position over wafer 2 to block illumination or to be retracted into a position that does not cover wafer 2. Exposure shield 36 may also be movable during wafer loading and unloading to aid in the wafer loading and unloading operation and in the global alignment of the wafer on the chuck. The size of alignment shield 36 may vary and the degree of extension over surface 50 of wafer 2 may be determined by the position of the alignment marks on the wafer or other factors. The distance that exposure shield extends over wafer 2 may vary and be separately programmable. Exposure shield 36 will be advantageously sized and positioned so as to affect only one of the exposure shots performed on a wafer. In this manner, the usable device patterns for active and/or test die being formed in the other exposure shots, is not compromised.

Figure 7:
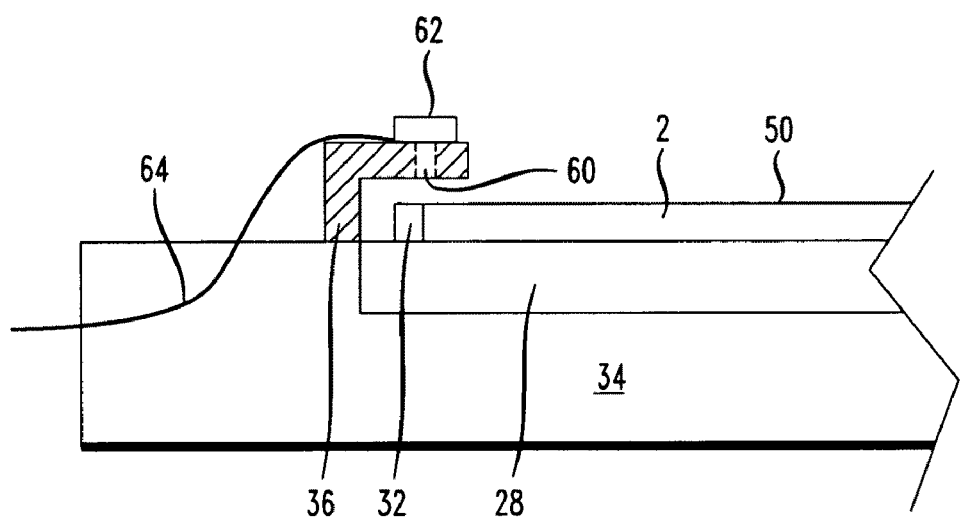
FIG. 7 is a side view showing another exemplary exposure shield according to the invention.

In another exemplary embodiment such as shown in FIG. 7, the exposure shield may include an aperture and a cover for the aperture. Aperture 60 extends through exposure shield 36 in the embodiment illustrated in FIG. 7. Cover 62 covers aperture 60 and is coupled by electric wire 64 to programming means that position cover 62. Cover 62 may be in blocking position as illustrated, in which case exposure shield 36 acts similar to the exposure shield shown in FIGS. 5 and 6. In another exemplary embodiment in which cover 62 is not positioned over aperture 60, exposure shield 36 will include an aperture that allows light to reach the portions of wafer 2 that are directly beneath the aperture while blocking the illumination from exposing the immediately adjacent areas.

The preceding merely illustrates the principles of the invention. It will thus be appreciated that those skilled in the art will be able to devise various arrangements which, although not explicitly described or shown herein, embody the principles of the invention and are included within its spirit and scope. For example, there may be more or less than the two exposure shields disposed about the periphery of a wafer such as is illustrated in FIG. 6. The exposure shields may be disposed at various and appropriate locations about the wafer edge depending on the number and location of alignment marks.

All examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An optical lithography exposure apparatus comprising a chuck for retaining a semiconductor wafer thereon and at least one shield that extends over a discrete portion of a peripheral edge of said semiconductor wafer when said semiconductor wafer is disposed on said chuck, each said shield blocking a subjacent wafer portion from being exposed with illumination and being moveable to a position that does not overhang said chuck, wherein each said shield is moveable responsive to a signal produced by a process recipe used to program exposure settings of said optical lithography exposure apparatus.

2. The optical lithography exposure apparatus as in claim 1, further comprising an alignment mark formed on said semiconductor wafer in each said subjacent wafer portion.

3. The optical lithography exposure apparatus as in claim 1, wherein said chuck is disposed on a stage and each said shield is a cantilever attached to an anchor coupled to said stage.

4. The optical lithography exposure apparatus as in claim 1, further comprising each said shield being arcuately movable around said peripheral edge.

5. The optical lithography exposure apparatus as in claim 1, wherein said optical lithography exposure apparatus comprises a scanner or stepper.

6. The optical lithography exposure apparatus as in claim 1, wherein at least one said shield is pivotable to said position that does not overhang said chuck.

7. The optical lithography exposure apparatus as in claim 6, wherein at least one said shield is pivotable about an axis that is parallel to said chuck.

8. The optical lithography exposure apparatus as in claim 1, wherein said shield is retractable radially outward.

9. The optical lithography exposure apparatus as in claim 1, further comprising an illumination source and wherein each said shield is disposed between said illumination source and said semiconductor wafer and comprises a flat retractable protuberance having a plane parallel to a surface of said semiconductor wafer.

10. The optical lithography exposure apparatus as in claim 1, wherein each said shield includes an aperture that allows illumination from an illumination source to reach said semiconductor wafer beneath said shield, said aperture including a separately controllable cover that closes said aperture.

11. The optical lithography exposure apparatus as in claim 1, wherein each said shield comprises an opaque shield, each said shield blocking a subjacent wafer portion from being exposed with illumination, coupled to a stage upon which said chuck is disposed, and being disposed at a location such that each said subjacent wafer portion includes an alignment mark of said semiconductor wafer therein when said semiconductor wafer is automatically loaded onto said chuck.

12. An optical lithography exposure apparatus comprising a chuck for retaining a semiconductor wafer thereon and at least one shield that extends over a discrete portion of a peripheral edge of said semiconductor wafer when said semiconductor wafer is disposed on said chuck, each said shield blocking a subjacent wafer portion from being exposed with illumination and being moveable to a position that does not overhang said chuck, wherein at least one said shield retracts using a spring loaded mechanism.

13. A method far a patterning a semiconductor wafer comprising:
   loading said semiconductor wafer onto a chuck in an optical lithography exposure apparatus, said chuck disposed on a stage;
   causing at least one opaque shield to extend inwardly from a peripheral edge of said chuck, over a peripheral edge of said chuck and covering a peripheral edge portion of said semiconductor wafer; and
   exposing said semiconductor wafer with an illumination source such that blocked portions of said semiconductor wafer beneath said shield are not exposed,
   wherein said causing comprises programming exposure settings of said optical lithography exposure apparatus using a recipe that directs said at least one opaque shield to extend inwardly after said semiconductor wafer is loaded onto said chuck.

14. The method as in claim 13, wherein said exposing comprises stepping along said semiconductor wafer to a plurality of locations and separately exposing said plurality of locations, said optical lithography exposure apparatus comprising a stepper or a scanner.

15. The method as in claim 14, wherein each said opaque shield is positioned at a peripheral location corresponding to locations of alignment marks of said semiconductor wafer when said semiconductor wafer is automatically loaded onto said chuck, said semiconductor wafer being a patterned wafer having said alignment marks in said blocked portions.

16. The method as in claim 13, further comprising coating said semiconductor wafer with a positive photosensitive material prior to said loading, developing said exposed semiconductor wafer thereby forming a patterned semiconductor wafer, and subsequently etching said patterned semiconductor wafer, wherein said blocked portions are not etched during said etching and include at least one alignment mark therein.

17. The method as in claim 13, further comprising causing said at least one opaque shield to retract to a position that does not overhang said chuck after said exposing.

18. The method as in claim 13, wherein said opaque shield includes an opening therethrough, said opening covered by a cover and further comprising causing said cover to move thereby uncovering said opening and allowing said exposing to illuminate a location on said wafer beneath said opening.

* * * * *